(12) United States Patent
Bu

(10) Patent No.: US 11,349,104 B2
(45) Date of Patent: May 31, 2022

(54) DISPLAY PANEL AND METHOD OF MANUFACTURING THE SAME

(71) Applicant: Wuhan China Star Optoelectronics Semiconductor Display Technology Co., Ltd., Wuhan (CN)

(72) Inventor: Chenghao Bu, Wuhan (CN)

(73) Assignee: Wuhan China Star Optoelectrenics Semiconductor Display Technology Co., Ltd., Wuhan (CN)

( * ) Notice: Subject to any disclaimer, the term of this patent is extended or adjusted under 35 U.S.C. 154(b) by 92 days.

(21) Appl. No.: 16/326,203

(22) PCT Filed: Nov. 7, 2018

(86) PCT No.: PCT/CN2018/114369
§ 371 (c)(1),
(2) Date: Feb. 17, 2019

(87) PCT Pub. No.: WO2020/077704
PCT Pub. Date: Apr. 23, 2020

(65) Prior Publication Data
US 2020/0176720 A1 Jun. 4, 2020

(30) Foreign Application Priority Data
Oct. 15, 2018 (CN) .......................... 201811195570.5

(51) Int. Cl.
*H01L 51/56* (2006.01)
*H01L 51/00* (2006.01)
*H01L 51/52* (2006.01)

(52) U.S. Cl.
CPC .......... *H01L 51/56* (2013.01); *H01L 51/0017* (2013.01); *H01L 51/0021* (2013.01); *H01L 51/0097* (2013.01); *H01L 51/5253* (2013.01)

(58) Field of Classification Search
CPC . H01L 51/0017; H01L 51/5253; H01L 51/56; H01L 51/0021; H01L 51/0097; H01L 27/1248; H01L 27/1255; H01L 27/3262; H01L 27/1218
See application file for complete search history.

(56) References Cited

U.S. PATENT DOCUMENTS 8,012,881 B1 * 9/2011 Lee .................... H01L 21/32139
438/736
10,269,830 B1 4/2019 Hu
10,453,872 B1 * 10/2019 Wang .................. H01L 27/1248
(Continued)

FOREIGN PATENT DOCUMENTS

CN 107424957 12/2017
CN 107946247 4/2018
(Continued)

*Primary Examiner* — Vongsavanh Sengdara

(57) ABSTRACT

A display panel and a method of manufacturing the same are provided. The method of manufacturing the display panel includes providing a substrate, and forming other layers on the substrate sequentially. Accordingly, a first via hole, a second via hole, and a third via hole are formed. The first via hole and the second via hole are filled with a flexible material to form a flexible layer and a stress release unit, respectively. Then, a metal layer which fills the third via hole is formed on the interlayer dielectric layer.

10 Claims, 10 Drawing Sheets

(56) References Cited

U.S. PATENT DOCUMENTS

2003/0224560 A1* 12/2003 Odaka .............. H01L 21/76802
　　　　　　　　　　　　　　　　　　　　　　438/148
2018/0366496 A1　12/2018　Li
2019/0164998 A1* 5/2019　Cho .................... G09G 3/3266
2019/0341407 A1　11/2019　Wang

FOREIGN PATENT DOCUMENTS

| CN | 108288637 | 7/2018 |
| CN | 108550612 | 9/2018 |
| CN | 108598091 | 9/2018 |

* cited by examiner

DISPLAY PANEL AND METHOD OF MANUFACTURING THE SAME

RELATED APPLICATIONS

This application is a National Phase of PCT Patent Application No. PCT/CN2018/114369 having International filing date of Nov. 7, 2018, which claims the benefit of priority of Chinese Patent Application No. 201811195570.5 filed on Oct. 15, 2018. The contents of the above applications are all incorporated by reference as if fully set forth herein in their entirety.

FIELD AND BACKGROUND OF THE INVENTION

The present invention relates to the field of display, and in particular, to a display panel and a method of manufacturing the same.

In the flat panel display technology, the organic light-emitting diode (OLED) displays have many advantages such as being light and thin, active illumination, fast response time, wide viewing angle, wide color gamut, high brightness and low power consumption, thus becoming the third generation display technology following the liquid crystal displays (LCDs). Compared with LCDs, OLEDs have the advantages of more power saving, reduced thickness, and wider viewing angles, which is unmatched by LCDs. At present, people have higher requirements on the screen ratio of the display panel.

Nowadays, the display panels on the market mainly focus on static edge bending, that is, only the edge of the display panel is bent at a fixed radius of curvature, but the display area is not bent. Thus, a real dynamic bending is not achieved yet. Therefore, it is necessary to optimize the design of the display panel, so that the screen can be truly flexible, bendable, and curable. Furthermore, how to design the etching process for the main via holes in the display panel is also one of the important issues that need to be optimized.

In order to solve the above problems, there is a need for a display panel and a method of manufacturing the same.

SUMMARY OF THE INVENTION

The present invention provides a display panel and a manufacturing method thereof to solve the problem that the etching process of the main via holes in the existing display panel is relatively complicated.

In order to solve the above problems, the technical solution provided by the present invention are as follows:

The present invention provides a method of manufacturing a display panel, including:

step S10, providing a substrate, sequentially forming a water-oxygen barrier layer, a buffer layer, an active layer, a first gate insulating layer, a first gate layer, a second gate insulating layer, a second gate layer, and an interlayer dielectric layer on the substrate, to form a first substrate including a display area and a non-display area;

step S20, forming a first via hole in the non-display area of the first substrate, forming a second via hole in a display area of the first substrate, wherein the first via hole is in contact with the substrate and penetrates through all of the layers other than the substrate, and the second via hole is in contact with the water-oxygen barrier layer and penetrates through all of the layers other than the substrate and the water-oxygen barrier layer;

step S30, filling the first via hole and the second via hole with a flexible material to form a flexible layer in the first via hole and a stress releasing unit in the second via hole;

step S40, forming a third via hole in the display region of the first substrate, wherein the third via hole is in contact with the active layer; and step S50, forming a metal layer on the interlayer dielectric layer, wherein the third via hole is filled with the metal layer.

According to an embodiment of the present invention, the first via hole includes superimposed first and second regions.

According to an embodiment of the present invention, the step S20 includes:

step S201, performing a lithography process using a first photomask to form the first region of the first via hole in the non-display area of the first substrate, wherein the first photomask has a pattern matching a pattern of the first region of the first via hole;

step S202, performing a lithography process using a second photomask to form the second region of the first via hole in the first via hole, thereby forming the first via hole, wherein the second photomask has a pattern matching a pattern of the second region of the first via hole;

step S203: performing a lithography process using a third photomask to form the second via hole in the display area of the first substrate, wherein the third photomask has a pattern matching a pattern of the second via hole.

According to an embodiment of the present invention, the step S20 includes:

step S201, performing a lithography process using a first photomask to form the first region of the first via hole in the non-display area of the first substrate, the first photomask has a pattern matching a pattern of the first region of the first via hole;

Step S202, performing a lithography process using a fourth photomask to form the second region of the first via hole in the first region of the first via hole, and forming the second via hole in the display region of the first substrate simultaneously, wherein the fourth photomask has a pattern matching a pattern of the second region of the first via hole and a pattern of the second via hole.

According to another aspect of the present invention, a method of manufacturing a display panel is provided, including:

step S10, providing a substrate, sequentially forming a water-oxygen barrier layer, a buffer layer, an active layer, a first gate insulating layer, a first gate layer, a second gate insulating layer, a second gate layer, and an interlayer dielectric layer on the substrate, to form a first substrate including a display area and a non-display area;

step S20, forming a first via hole in the non-display area of the first substrate, forming a second via hole and a third via hole in a display area of the first substrate, wherein the first via hole is in contact with the substrate and penetrates through all of the layers other than the substrate, the second via hole is in contact with the water-oxygen barrier layer and penetrates through all of the layers other than the substrate and the water-oxygen barrier layer, and the third via hole is in contact with the active layer;

step S30, filling the first via hole and the second via hole with a flexible material to form a flexible layer in the first via hole and a stress releasing unit in the second via hole; and step S40, forming a metal layer on the interlayer dielectric layer, the third via hole being filled with the metal layer;

wherein the first via hole, the second via hole and the third via hole are prepared by gas etching using an etching gas including hydrogen.

According to an embodiment of the present invention, the first via hole includes superimposed first and second regions.

According to an embodiment of the present invention, the step S20 includes:

step S201, performing a lithography process using the first photomask to form the first region of the first via hole in the non-display area of the first substrate, wherein the first photomask has a pattern matching a pattern of the first region of the first via hole;

step S202, performing a lithography process using a sixth photomask to form the second region of the first via hole in the first via hole, and to form the second via hole and the third via hole in the display area simultaneously, wherein the sixth photomask has a pattern matching a pattern of the second region of the first via hole, a pattern of the second via hole, and a pattern of the third via hole.

According to an embodiment of the present invention, the step S20 includes: performing a lithography process using a seventh photomask to form the first via hole, the second via hole and the third via hole on the first substrate, wherein the seventh photomask has a pattern matching a pattern of the first via hole, a pattern of the second via hole, and a pattern of the third via hole.

According to an embodiment of the present invention, the substrate is a flexible substrate, and the flexible substrate includes polyimide.

According to an embodiment of the present invention, the first via hole is formed by a dry etching process.

According to an embodiment of the present invention, the second via hole is disposed between pixel units of the display area and is separated from a functional device in the display area.

According to an embodiment of the present invention, the flexible material is an organic material.

According to an embodiment of the present invention, the method of manufacturing a display panel further includes forming a planarization layer, an anode layer, a pixel definition layer, and a support layer on the metal layer.

According to sill another aspect of the present invention, a display panel is provided, including a display area and a non-display area at a periphery of the display area, and the display panel includes: a substrate, a water-oxygen barrier layer, a buffer layer, an active layer, a first gate insulating layer, a first gate layer, a second gate insulating layer, a second gate layer, and an interlayer dielectric layer sequentially disposed, wherein a metal layer and a stress release unit are disposed in the display region of the display panel, and a flexible layer disposed in the non-display area of the display panel;

wherein the metal layer is disposed on the interlayer dielectric layer and is in contact with the active layer through a third via hole, the stress release unit is disposed in the second via hole, and the flexible layer is disposed in the first via hole, wherein the first via hole is in contact with the substrate and penetrates through all of the layers other than the substrate, and the second via hole is in contact with the water-oxygen barrier layer and penetrates through all of the layers other than the substrate and the water-oxygen barrier layer.

According to an embodiment of the present invention, the substrate is a flexible substrate, and the flexible substrate includes polyimide.

According to an embodiment of the present invention, the first via hole is formed by a dry etch process.

According to an embodiment of the present invention, the second via hole is disposed between pixel units of the display area and is separated from a functional device in the display area.

According to an embodiment of the present invention, the flexible material is an organic material.

According to an embodiment of the present invention, the display panel further includes a planarization layer, an anode layer, a pixel definition layer, and a support layer formed on the metal layer.

Advantageous Effects

The present invention provides a display panel and a method of manufacturing the same, such that different etching schemes can be selected according to actual needs during the process of preparing via holes of the display panel, through proposing various methods for preparing via holes of the display panel, thereby reducing the utilization times of the photomask, thus simplifying the manufacturing process of the display panel.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DESCRIPTION OF SPECIFIC EMBODIMENTS OF THE INVENTION

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

Figure 1:
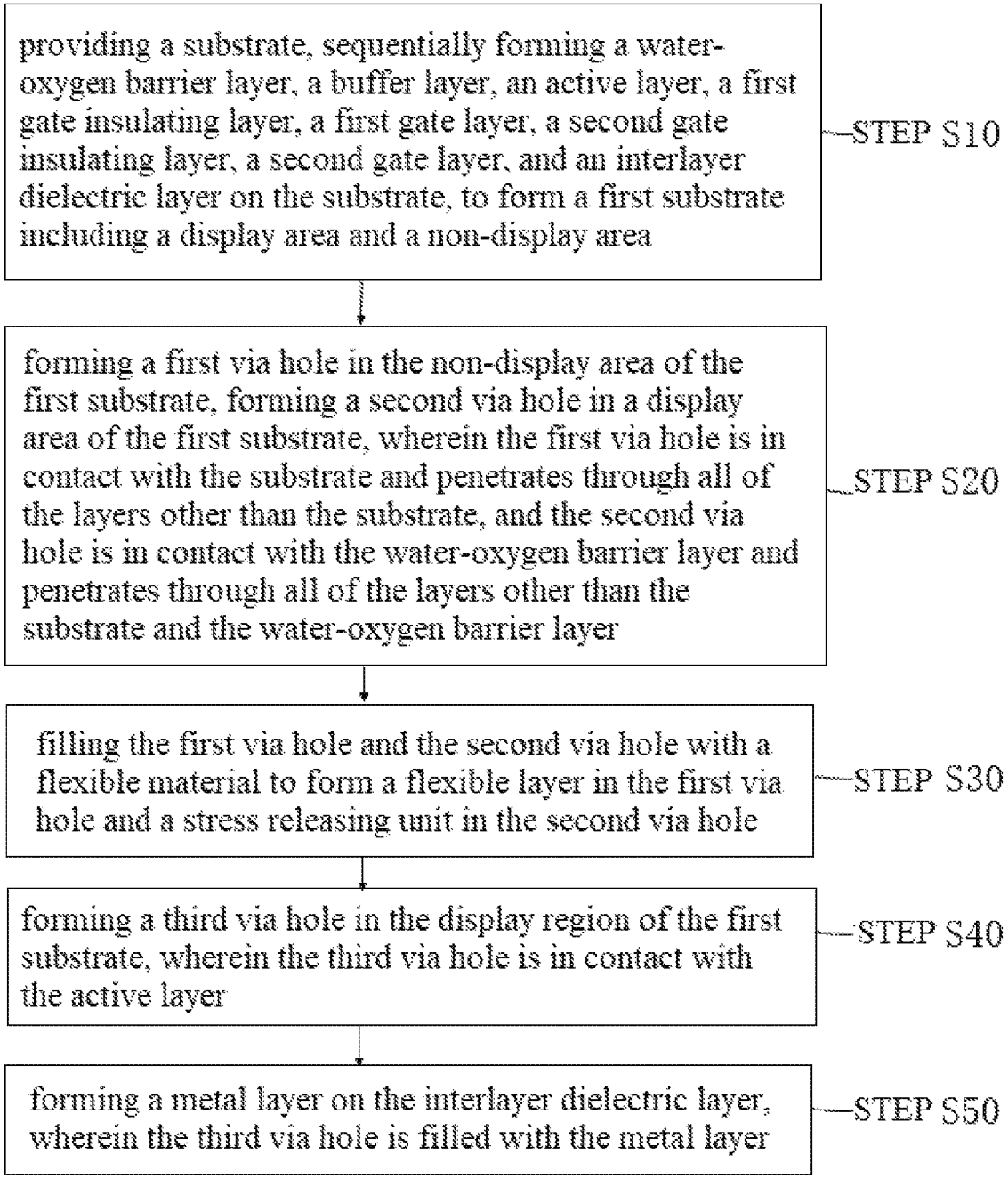
FIG. 1 is a schematic flow chart of a method of manufacturing a display panel according to an embodiment of the present invention.
Figure 2A:
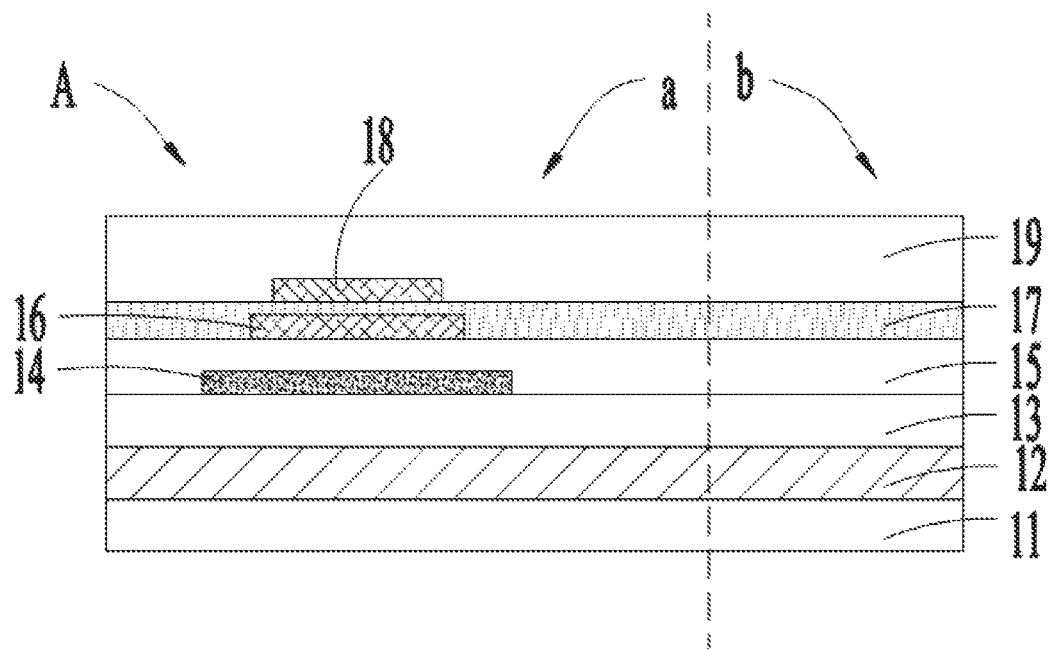
FIGS. 2*a*, 2*b*, 2*c*, 2*d*, 2*e*, 2*f*, and 2*g* are schematic structural diagrams of a method of manufacturing a display panel according to an embodiment of the present invention.

Please refer to FIG. 1 and FIGS. 2a-2g. FIG. 1 is a schematic flow chart of a method of manufacturing a display panel according to an embodiment of the present invention. FIGS. 2a-2g are schematic structural diagrams of a method of manufacturing a display panel according to an embodiment of the present invention. The present invention provides a method of manufacturing a display panel, including:

Please refer to FIG. 2a, step S10, providing a substrate 11, sequentially forming a water-oxygen barrier layer 12, a buffer layer 13, an active layer 14, a first gate insulating layer 15, a first gate layer 16, a second gate insulating layer 17, a second gate layer 18, and an interlayer dielectric layer 19 on the substrate 11, to form a first substrate A including a display area a and a non-display area b.

In one embodiment, the substrate 11 is a flexible substrate and the flexible substrate includes polyimide.

In one embodiment, the step S10 includes: providing a substrate 11 on which a water-oxygen barrier layer 12 having a thickness of 5000 Å and a buffer layer 13 having a thickness of 3,500 Å are sequentially formed by a physical vapor deposition technique. A material of the buffer layer 13 includes at least one of silicon nitride and silicon oxide. An amorphous silicon layer having a thickness of 500 Å is formed on the buffer layer 13, and the amorphous silicon layer is subjected to a laser annealing process, exposure, development, and etching to form the active layer 14. A first gate insulating layer 15 having a thickness of 1000 Å is formed on the active layer 14 by a physical vapor deposition technique. A gate metal having a thickness of 2500 Å is formed on the first gate insulating layer 15 by a sputtering process, and the gate metal is exposed and etched to form the first gate layer 16. A second gate insulating layer 17 is formed on the first gate layer 16 by a physical vapor deposition technique, and a material of the second gate insulating layer 17 may include silicon nitride. A gate metal is formed on the second gate insulating layer 17 by a sputtering process, and the gate metal is subjected to exposure and etching to form a second gate layer 18. Subsequently, an interlayer dielectric layer 19 having a thickness of 5000 Å is formed on the second gate layer 18 by physical vapor deposition technique.

Figure 2B:
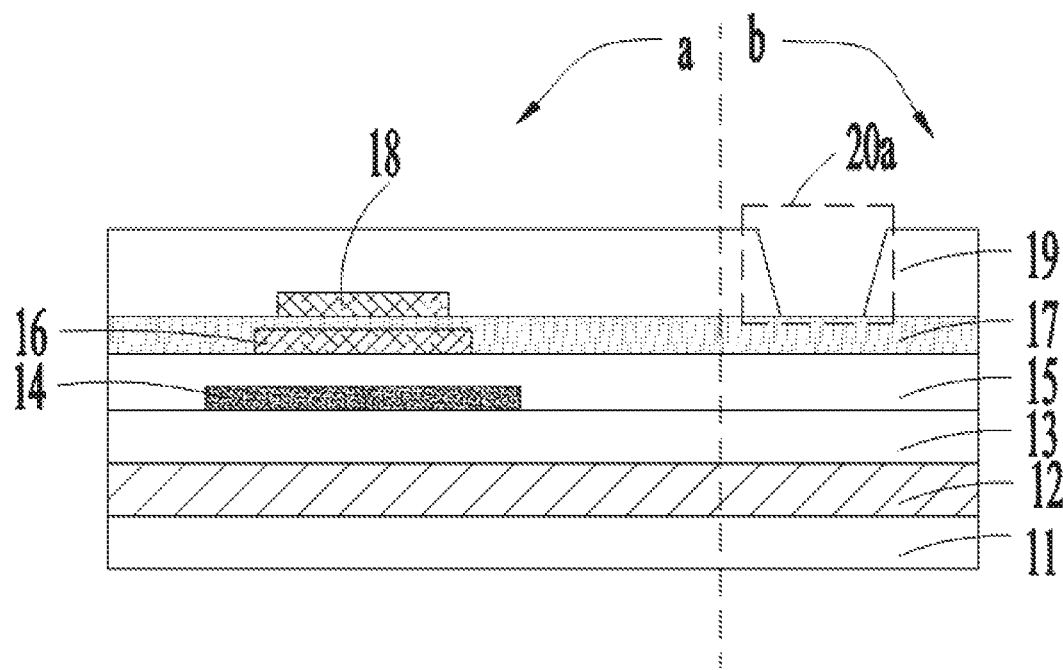
Figure 2C:
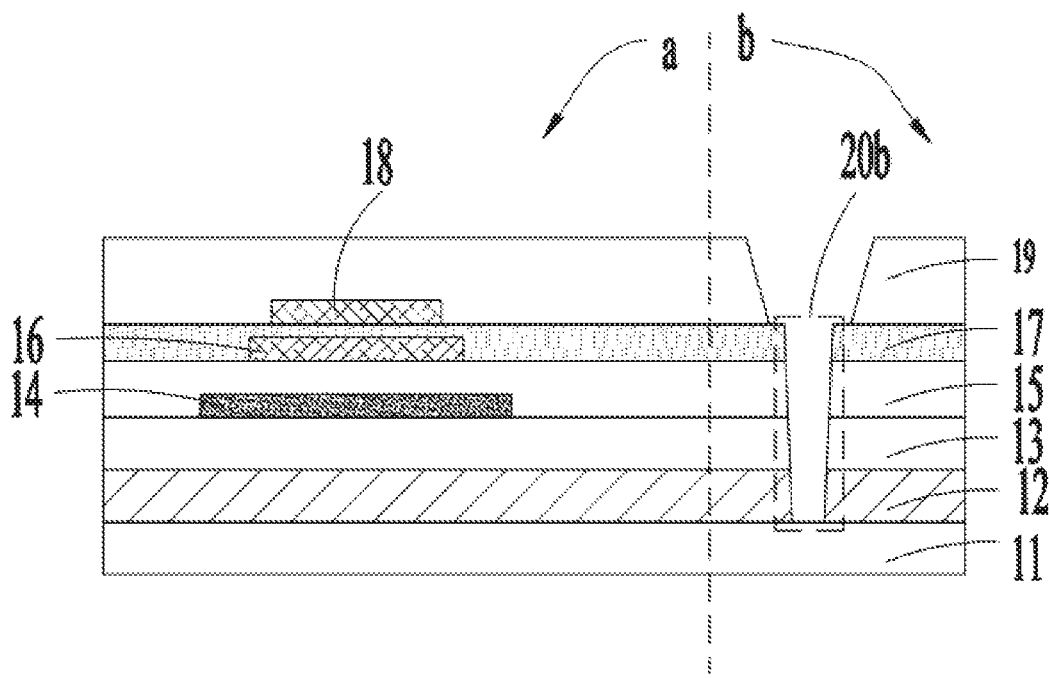
Figure 2D:
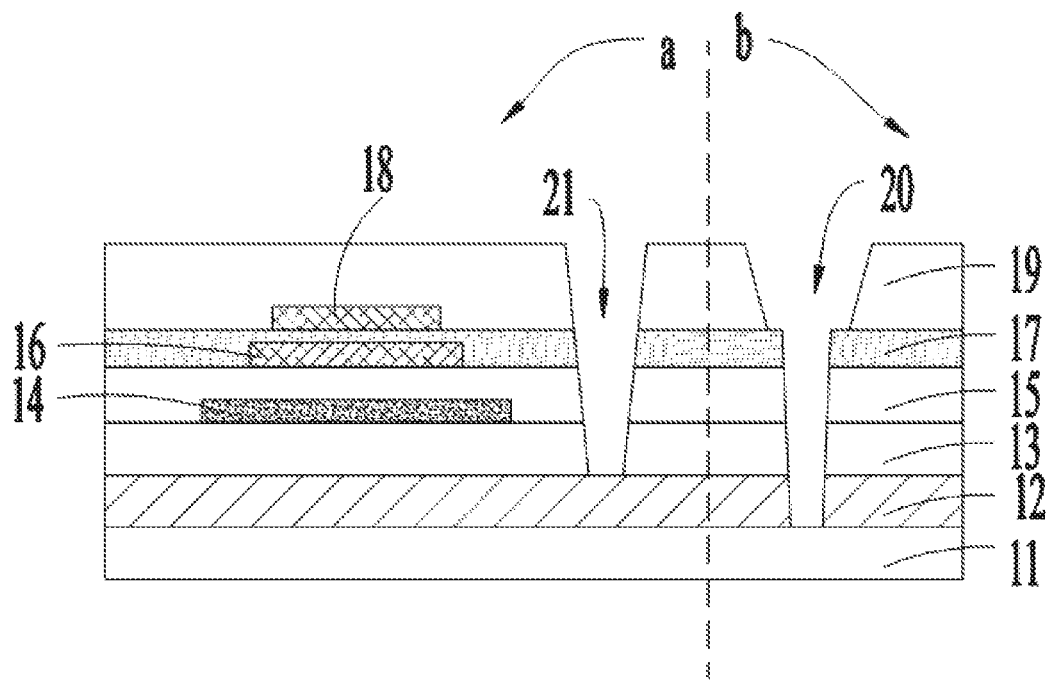

Please refer to FIGS. 2b-2d, step S20, forming a first via hole 20 in the non-display area b of the first substrate A, forming a second via hole 21 in a display area a of the first substrate A, wherein the first via hole 20 is in contact with the substrate 11 and penetrates through all of the layers other than the substrate 11, and the second via hole 21 is in contact with the water-oxygen barrier layer 12 and penetrates through all of the layers other than the substrate 11 and the water-oxygen barrier layer 12.

In one embodiment, the first via hole 20 includes superimposed first region 20a and second region 20b.

In the first embodiment of the present invention, the step S20 includes:

Please refer to FIG. 2b, step S201, performing a lithography process using a first photomask to form the first region 20a of the first via hole in the non-display area a of the first substrate A, wherein the first photomask has a pattern matching a pattern of the first region 20a of the first via hole;

In one embodiment, the first region 20a of the first via hole is formed by a dry etch process.

In one embodiment, the first region 20a of the first via hole has a target depth of 6,000 Å to 9000 Å.

Please refer to FIG. 2c, step S202, performing a lithography process using a second photomask to form the second region 20b of the first via hole in the first via hole 20, thereby forming the first via hole 20, wherein the second photomask has a pattern matching a pattern of the second region 20b of the first via hole.

In one embodiment, all the inorganic layers in the second region 20b of the first via hole are etched by dry etching to form the first via hole 20 in contact with the substrate 11. That is, the first via hole 20 is in contact with the substrate 11 and penetrates through all of the layers other than the substrate 11.

Please refer to FIG. 2d, step S203, performing a lithography process using a third photomask to form the second via hole 20 in the display area of the first substrate A, wherein the third photomask has a pattern matching a pattern of the second via hole 21.

In one embodiment, the second via hole 21 is disposed between the pixel units in the display area a and is separated from the functional devices in the display area, and the second via hole 21 is filled with a flexible material to mitigate the bending stress of the display panel when it is bent.

Figure 3A:
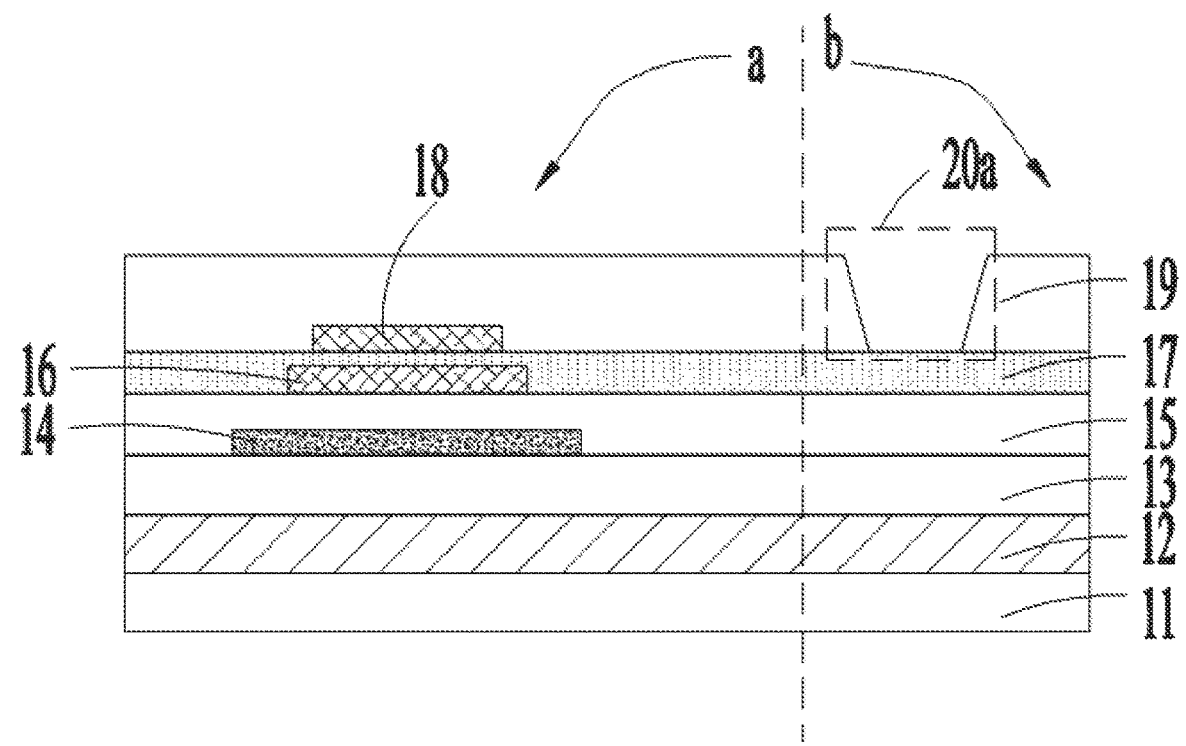
FIGS. 3*a*-3*b* are schematic structural diagrams of step S20 in a method of manufacturing a display panel according to another embodiment of the present invention.
Figure 3B:
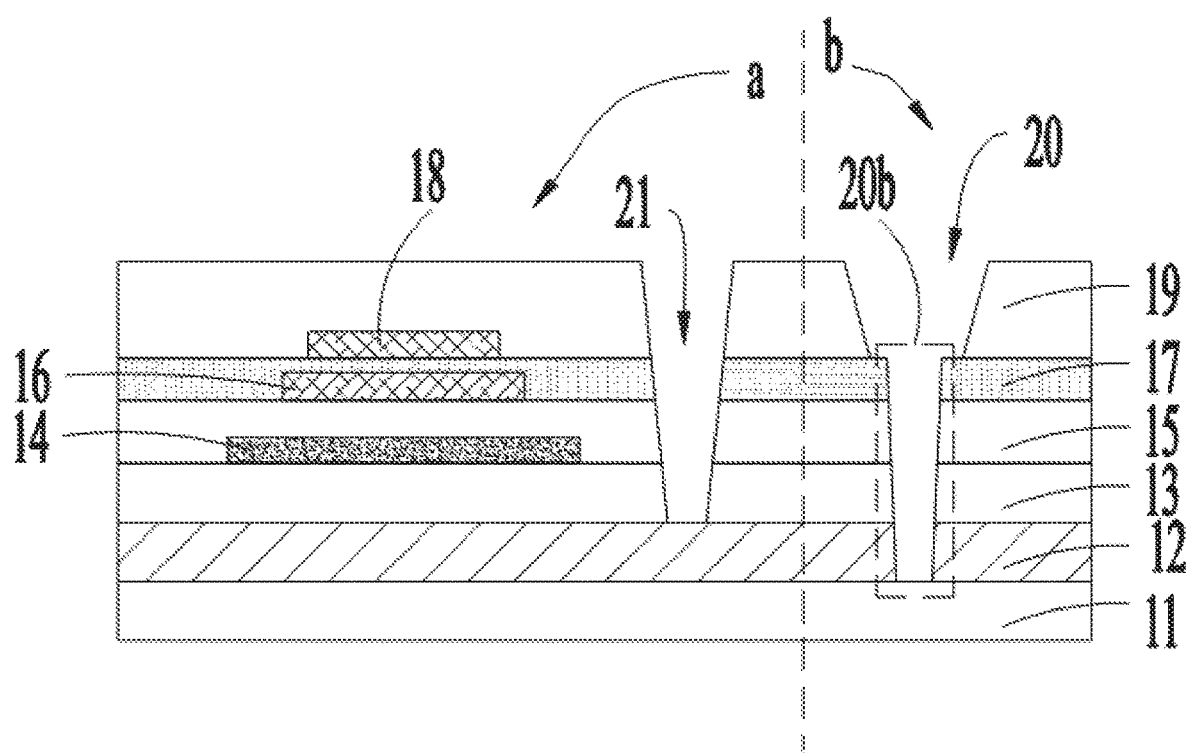
Figure 4:
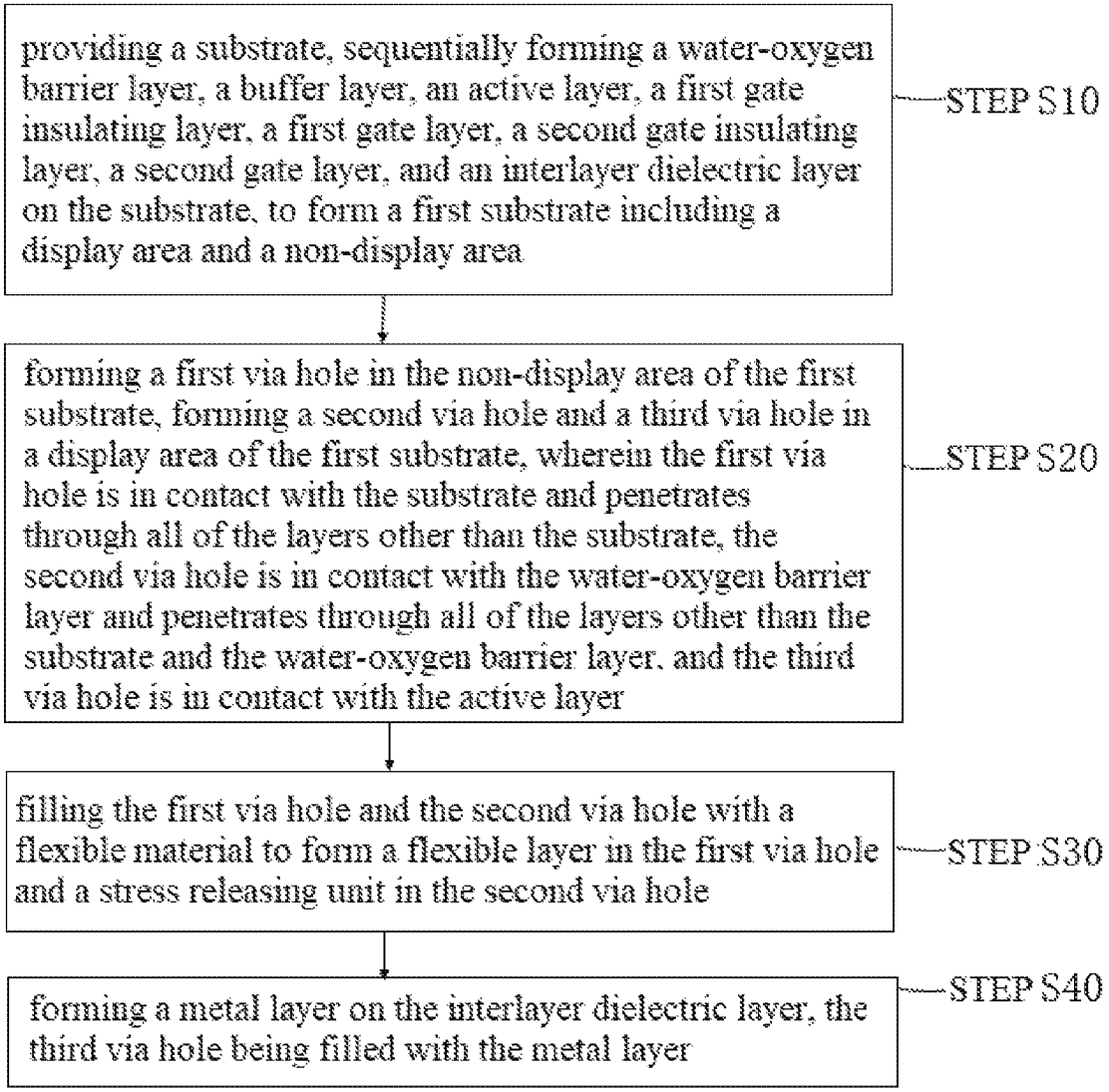
FIG. 4 is a schematic flow chart of a method of manufacturing a display panel according to a further embodiment of the present invention.

In the second embodiment, referring to FIG. 3a-3b, the step S20 includes the following steps.

Refer to FIG. 3a, step S201, forming a lithography process using the first photomask to form the first region 20a of the first via hole in the non-display area of the first substrate A, wherein the first photomask has a pattern matching a pattern of the first region 20a of the first via hole.

Refer to FIG. 3b, performing a lithography process using a fourth photomask to form the second region 20b of the first via hole in the first region 20a of the first via hole, and forming the second via hole 21 in the display region of the first substrate A simultaneously, wherein the fourth photomask has a pattern matching a pattern of the second region 20b of the first via hole and a pattern of the second via hole 21. Compared with the first embodiment, the second embodiment uses one photomask to form the second region 20b of the first via hole hold and the second via hole 21, so that one photomask can be saved.

Figure 2E:
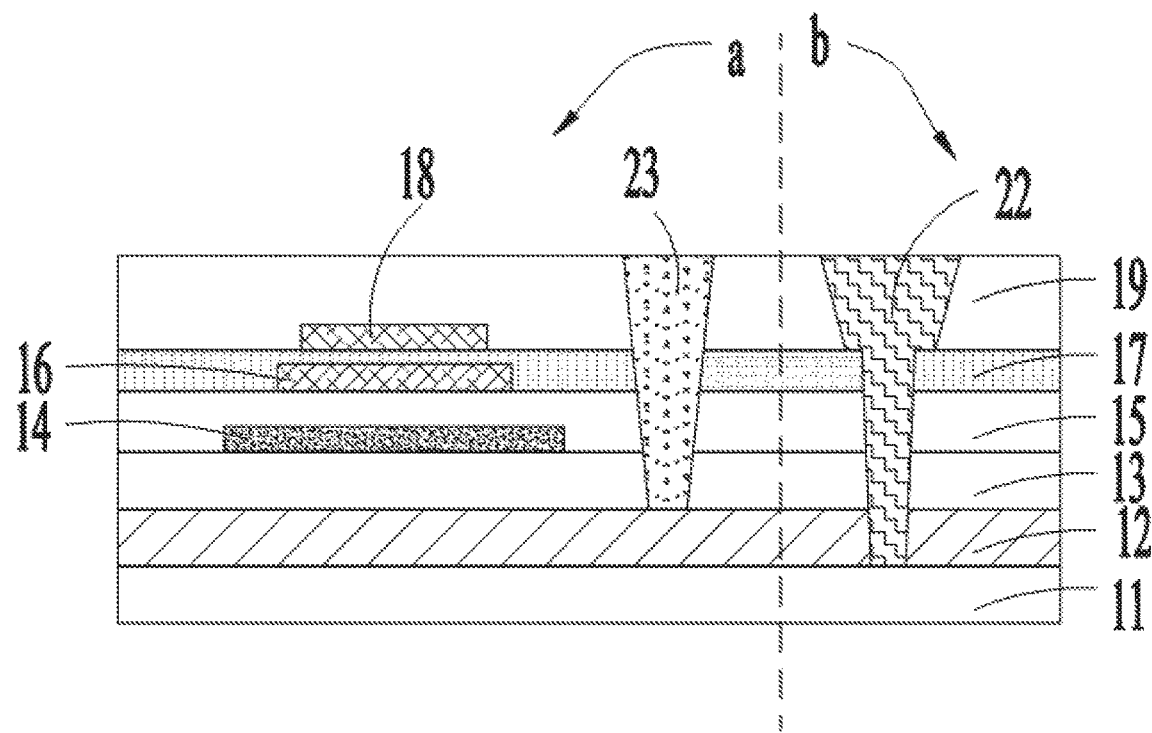

Refer to FIG. 2e, step S30, filling the first via hole 20 and the second via hole 21 with a flexible material to form a flexible layer 2 in the first via hole 20 and a stress releasing unit 23 in the second via hole 21.

In one embodiment, the flexible material is an organic material.

Figure 2F:
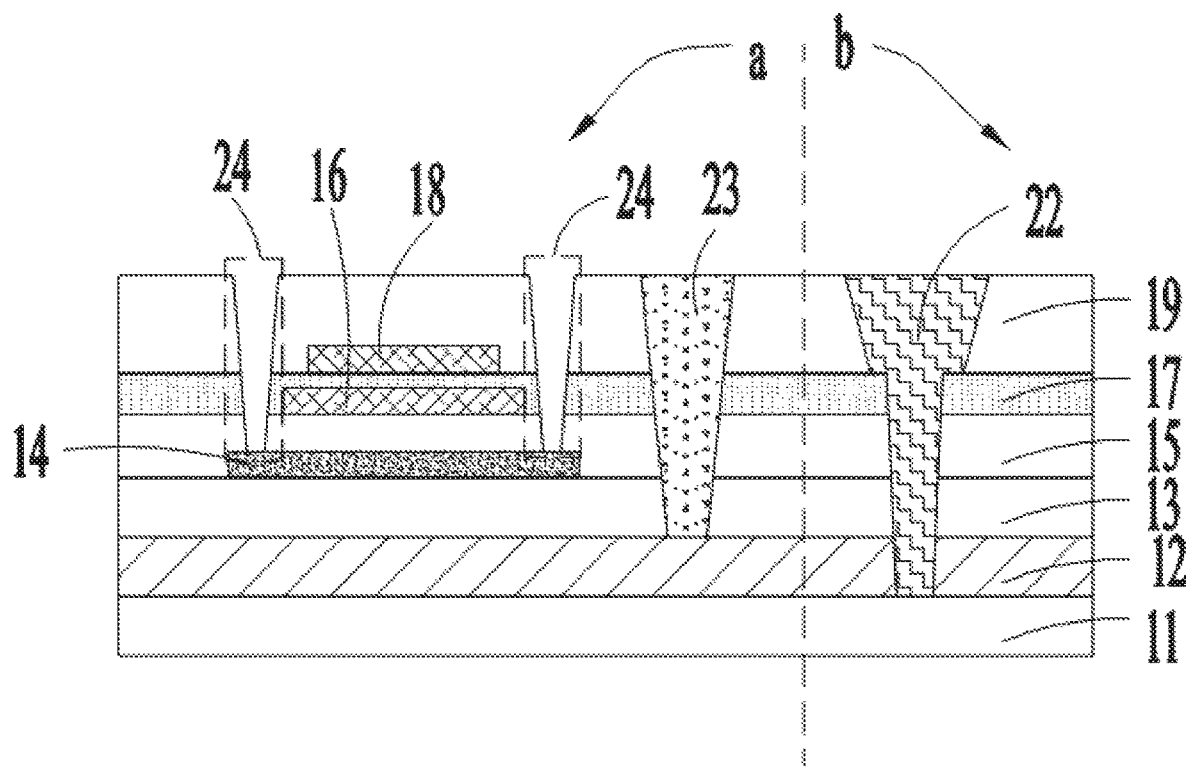

Refer to FIG. 2f, step S40, forming a third via hole 24 in the display region a of the first substrate A, wherein the third via hole 24 is in contact with the active layer 14.

In one embodiment, a target depth of the third via hole 24 may be the total thickness of the interlayer dielectric layer 19, the second gate insulating layer 17, and the first gate insulating layer 15.

Figure 2G:
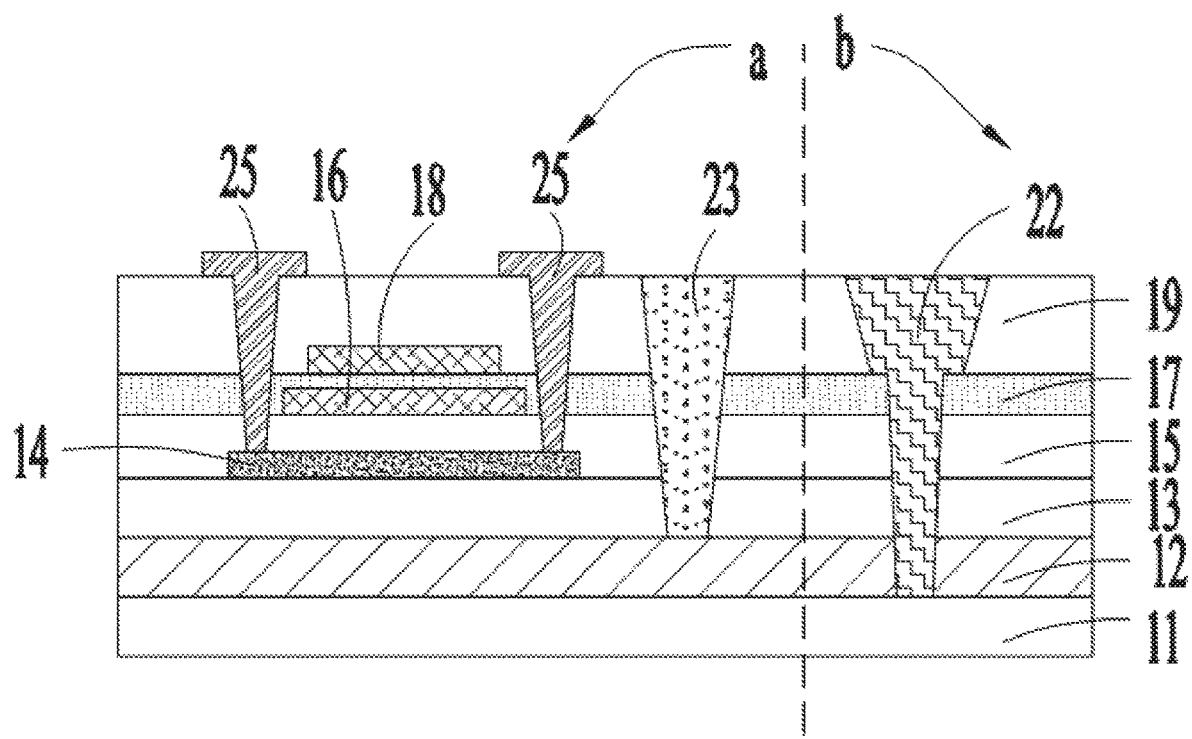

Refer to FIG. 2g, step S50, forming a metal layer 25 on the interlayer dielectric layer, wherein the third via hole 23 is filled with the metal layer 25.

In one embodiment, the method of manufacturing a display panel further includes: forming a planarization layer, an anode layer, a pixel definition layer, and a support layer on the metal layer.

According to another aspect of the present invention, a method of manufacturing a display panel is also provided. Referring to FIG. 4 and FIGS. 5a-5d, the method of manufacturing a display panel as shown includes the following steps.

Figure 5A:
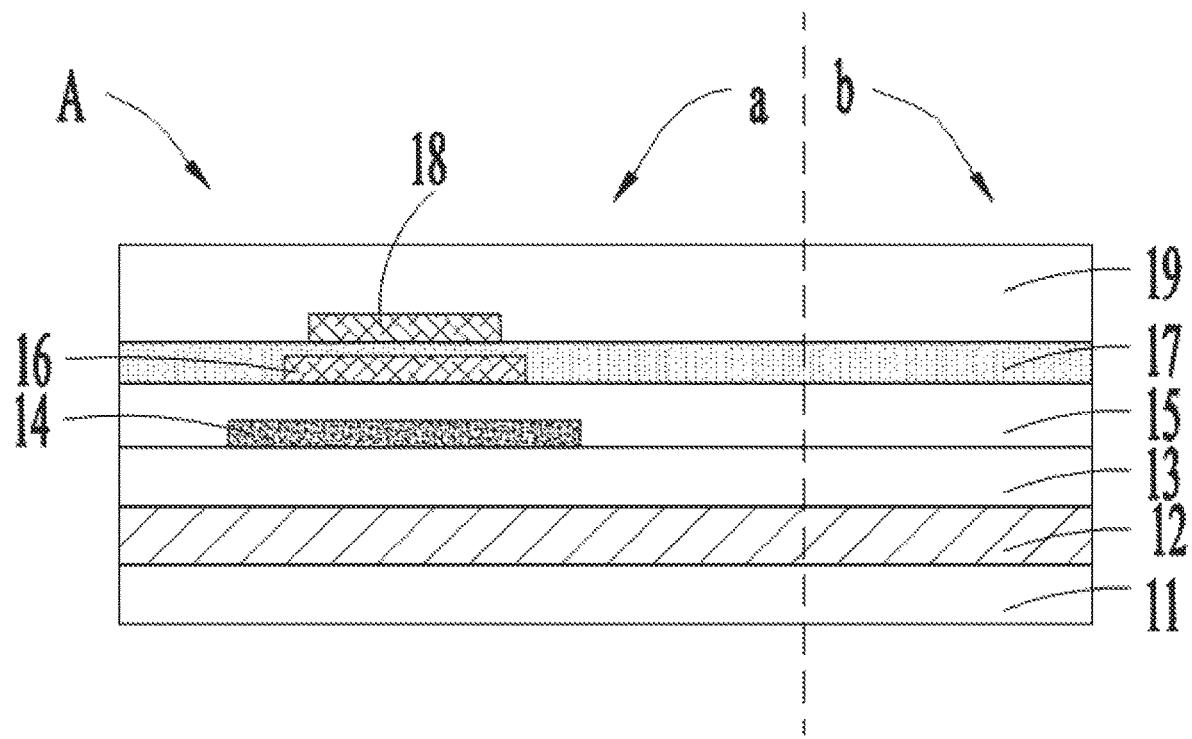
FIGS. 5*a*, 5*b*, 5*c* and 5*d* are schematic structural diagrams of a method of manufacturing a display panel according to a further embodiment of the present invention.

Refer to FIG. 5a, step S10, providing a substrate 11, sequentially forming a water-oxygen barrier layer 12, a buffer layer 13, an active layer 14, a first gate insulating layer 15, a first gate layer 16, a second gate insulating layer 17, a second gate layer 18, and an interlayer dielectric layer 19 on the substrate 11, to form a first substrate 21 including a display area a and a non-display area b.

In one embodiment, the step S10 includes: providing a substrate 11 on which a water-oxygen barrier layer 12 having a thickness of 5000 Å and a buffer layer 13 having a thickness of 3,500 Å are sequentially formed by a physical vapor deposition technique. A material of the buffer layer 13 includes at least one of silicon nitride and silicon oxide. An amorphous silicon layer having a thickness of 500 Å is formed on the buffer layer 13, and the amorphous silicon layer is subjected to a laser annealing process, exposure, development, and etching to form the active layer 14. A first gate insulating layer 15 having a thickness of 1000 Å is formed on the active layer 14 by a physical vapor deposition technique. A gate metal having a thickness of 2500 Å is formed on the first gate insulating layer 15 by a sputtering process, and the gate metal is subjected to exposure and etching to form the first gate layer 16. A second gate insulating layer 17 is formed on the first gate layer 16 by a physical vapor deposition technique, and a material of the second gate insulating layer 17 may include silicon nitride. A gate metal is formed on the second gate insulating layer 17 by a sputtering process, and the gate metal is subjected to exposure and etching to form a second gate layer 18. Subsequently, an interlayer dielectric layer 19 having a thickness of 5000 Å is formed on the second gate layer 18 by physical vapor deposition technique.

Figure 5B:
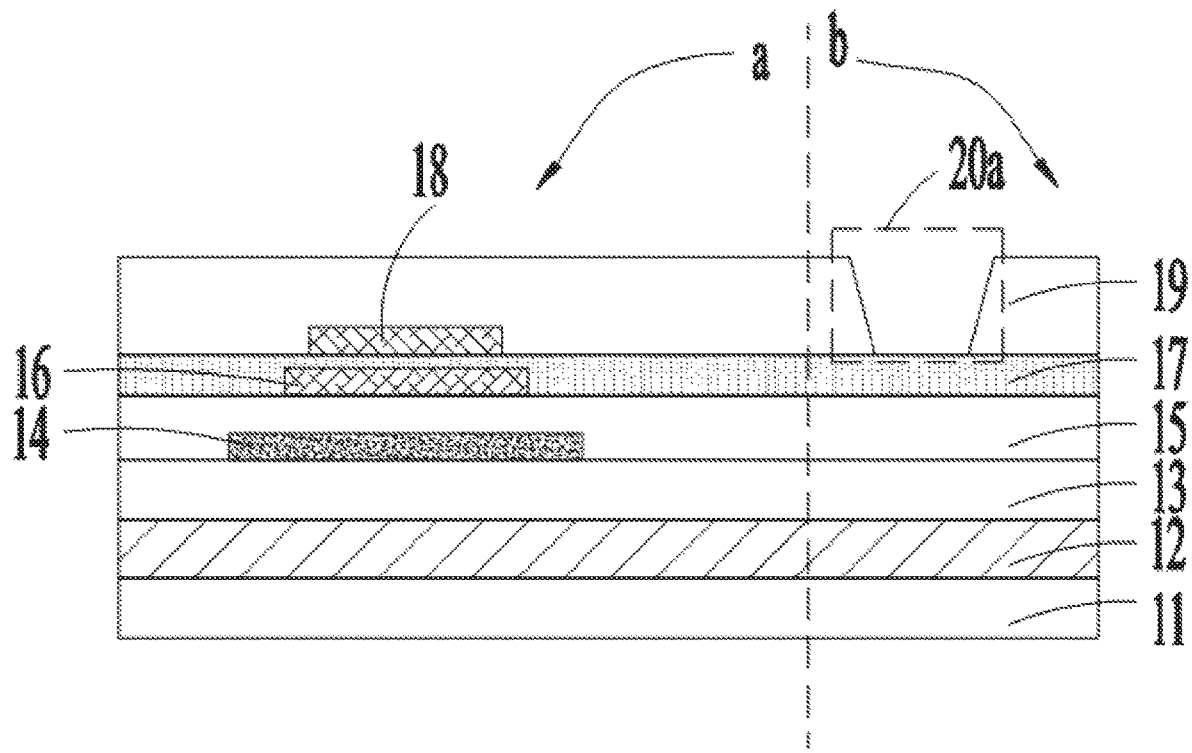
Figure 5C:
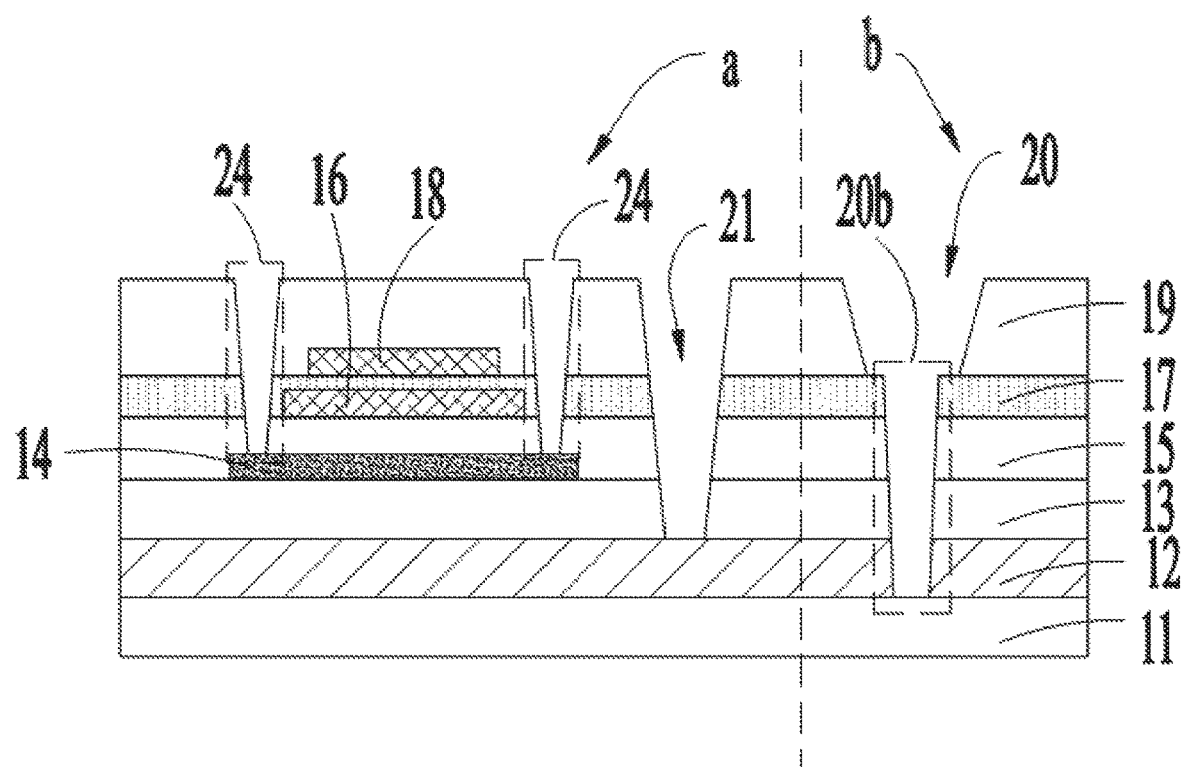

Please refer to FIGS. 5b-5c, step S20, forming a first via hole 20 in the non-display area b of the first substrate A, forming a second via hole 21 and a third via hole 24 in a display area a of the first substrate A, wherein the first via hole 20 is in contact with the substrate 11 and penetrates through all of the layers other than the substrate 11, and the second via hole 21 is in contact with the water-oxygen barrier layer 12 and penetrates through all of the layers other than the substrate 11 and the water-oxygen barrier layer 12, while the third via hole 24 is in contact with the active layer 14.

In the third embodiment of the present invention, the step S20 includes the following steps.

Refer to FIG. 2b, step S201, performing a lithography process using a first photomask to form the first region 20a of the first via hole in the non-display area a of the first substrate A, wherein the first photomask has a pattern matching a pattern of the first region 20a of the first via hole.

Refer to FIG. 5c, step S202, performing a lithography process using a sixth photomask to form the second region 20b of the first via hole in the first region 20a the first via hole, and to form the second via hole 21 and the third via hole 24 in the display area a of the first substrate A simultaneously, wherein the sixth photomask has a pattern matching a pattern of the second region 20b of the first via hole, a pattern of the second via hole 21, and a pattern of the third via hole 24.

Compared with the first embodiment, in the third embodiment, the second region 20b of the first via hole, the second via hole 21 and the third via hole 24 are prepared in the same photomask process, thus saving two photomask processes.

In the fourth embodiment, the step S20 includes: performing a lithography process using a seventh photomask to form the first via hole 20, the second via hole 21 and the third via hole on the first substrate, wherein the seventh photomask has a pattern matching a pattern of the first via hole, a pattern of the second via hole, and a pattern of the third via hole.

Figure 6:
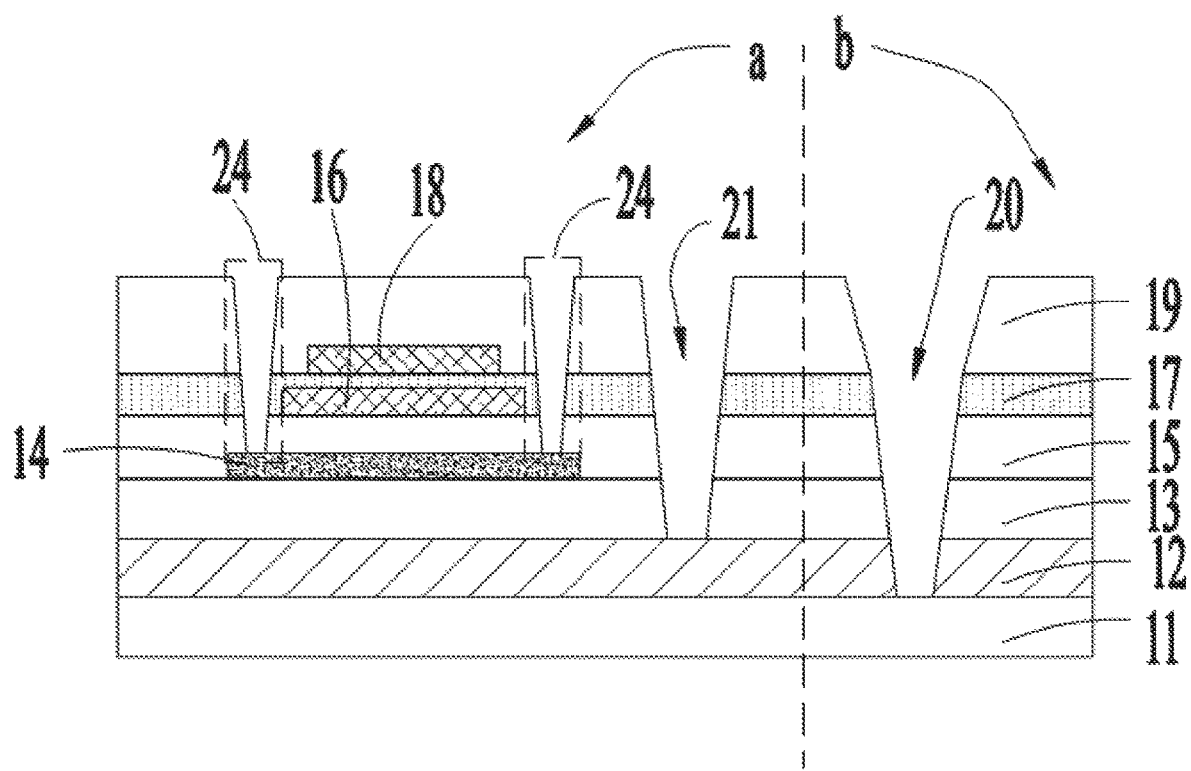
FIG. 6 is a schematic structural diagram of step S20 in a method of manufacturing a display panel according to still another embodiment of the present invention.

Referring to FIG. 6, compared with the first embodiment, in the fourth embodiment, the first via hole 20, the second via hole 21, and the third via hole 24 are all prepared by the same photomask process, thus saving three photomask processes, without formation of a step at the first via hole 21.

Refer to FIG. 5c, step S30, filling the first via hole 20 and the second via hole 21 with a flexible material to form a flexible layer 22 in the first via hole 20 and a stress releasing unit 23 in the second via hole 21 respectively.

Figure 5D:
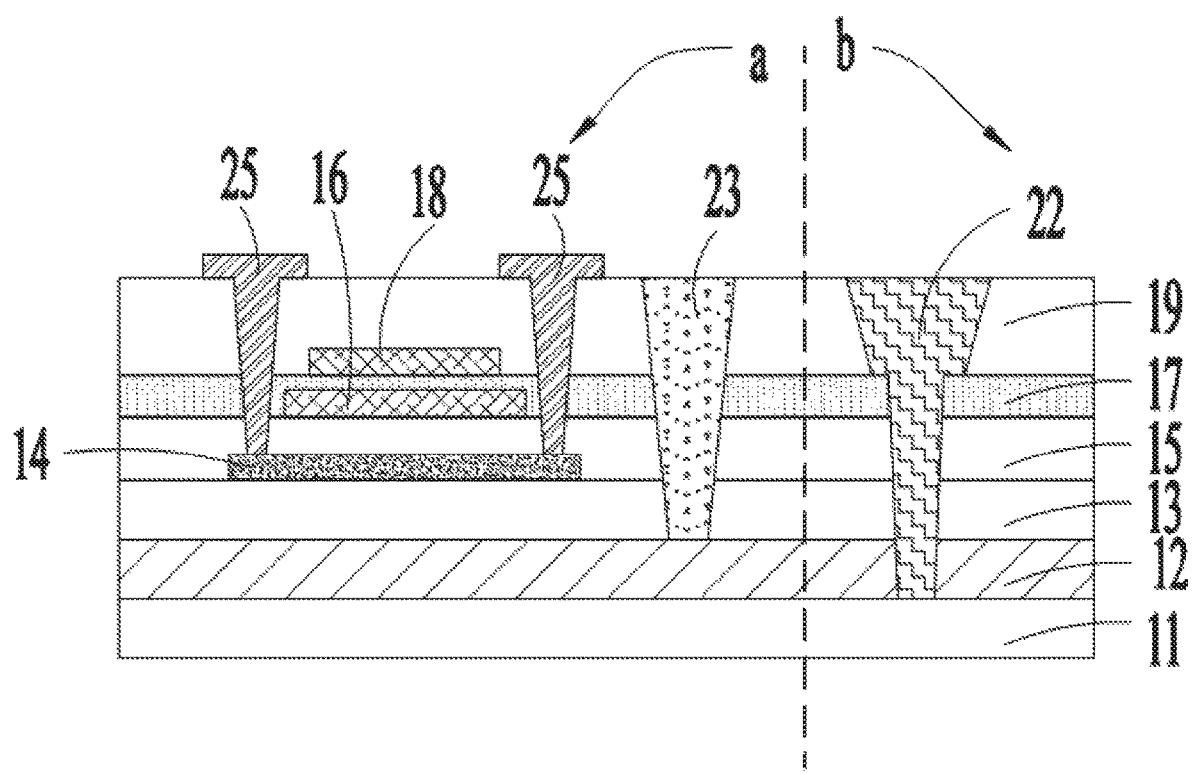

Refer to FIG. 5d, step S40, forming a metal layer 25 on the interlayer dielectric layer 19, the metal layer 25 filing the third via hole 24.

The first via hole 20, the second via hole 21, and the third via hole 24 are prepared by gas etching, and the etching gas includes hydrogen gas. The erosion of the active layer 14 is slowed down by introducing hydrogen gas into the etching gas.

In one embodiment, the manner in which the metal layer 25 is in contact with the active layer 14 may be a surface contact or a side contact, depending on the depth of the third via hole 24.

In one embodiment, the first via hole 20 includes the superimposed first region 20a and second region 20b.

Figure 7:
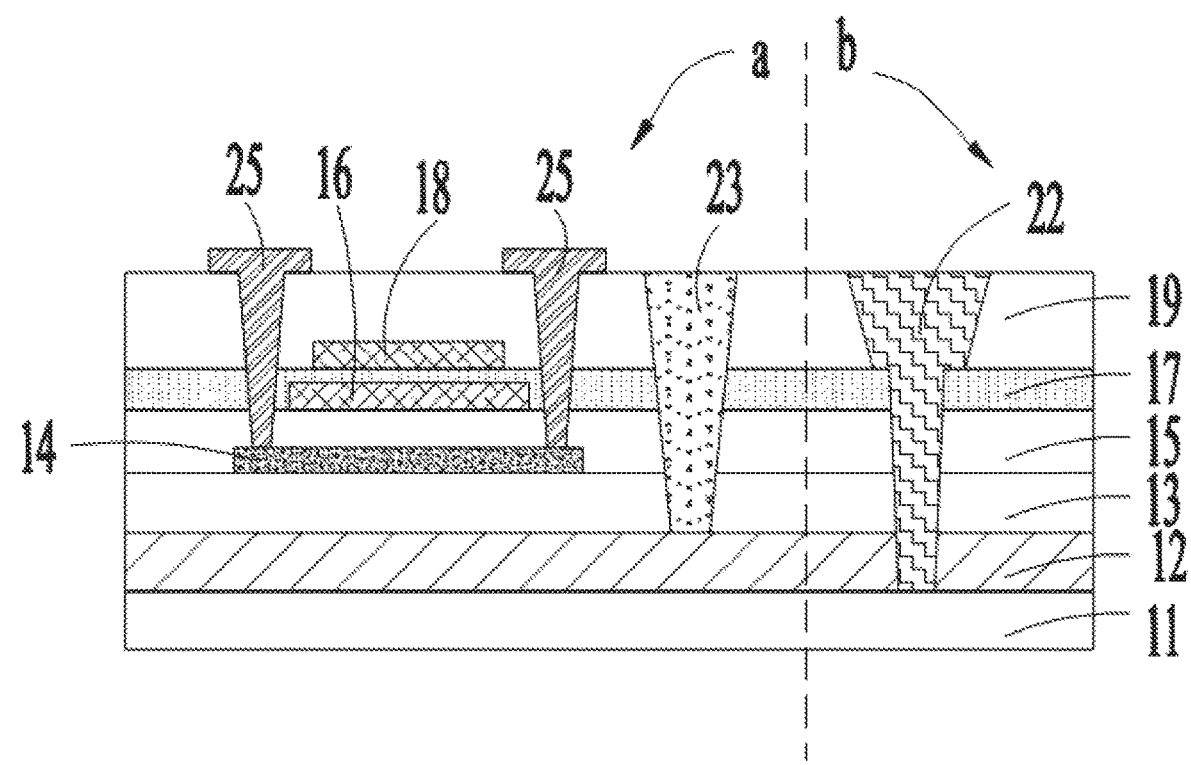
FIG. 7 is a schematic structural diagram of a display panel according to still a further embodiment of the present invention.

According to still another aspect of the present invention, a display panel is also provided. Referring to FIG. 7, the display panel includes a display area a and a non-display area b disposed at a periphery of the display area a. The display panel includes: a substrate 11, a water-oxygen barrier layer 12, a buffer layer 13, an active layer 14, a first gate insulating layer 15, a first gate layer 16, a second gate insulating layer 17, a second gate layer 18, and an interlayer dielectric layer 19 sequentially disposed; a metal layer 25 and a stress release unit 23 disposed in the display region a of the display panel; and a flexible layer 22 disposed in the non-display area b of the display panel;

The metal layer 25 is disposed on the interlayer dielectric layer 19 and is in contact with the active layer 14 through a third via hole 24, the stress release unit 23 is disposed in the second via hole 21, and the flexible layer 22 is disposed in the first via hole 20, wherein the first via hole 20 is in contact with the substrate 11 and penetrates through all of the layers other than the substrate 11, and the second via hole 21 is in contact with the water-oxygen barrier layer 12 and penetrates through all of the layers other than the substrate 11 and the water-oxygen barrier layer 12.

The present invention provides a display panel and a method of manufacturing the same, in which various approaches for preparing via holes in the display panel are proposed, such that different etching schemes can be selected according to actual needs during the process of preparing via holes of the display panel to reduce the number of times of the photomask used and to simply the manufacturing process of the display panel.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A method of manufacturing a display panel, comprising:

step S10, providing a substrate, sequentially forming a water-oxygen barrier layer, a buffer layer, an active layer, a first gate insulating layer, a first gate layer, a second gate insulating layer, a second gate layer, and an interlayer dielectric layer on the substrate, to form a first substrate including a display area and a non-display area;

step S20, forming a first via hole in the non-display area of the first substrate, forming a second via hole in a display area of the first substrate, wherein the first via hole is in contact with the substrate and penetrates through all of the layers other than the substrate, and the second via hole is in contact with the water-oxygen barrier layer and penetrates through all of the layers other than the substrate and the water-oxygen barrier layer;

step S30, filling the first via hole and the second via hole with a flexible material to form a flexible layer in the first via hole and a flexible material unit in the second via hole;

step S40, forming a third via hole in the display region of the first substrate, wherein the third via hole is in contact with the active layer; and step S50, forming a metal layer on the interlayer dielectric layer, wherein the third via hole is filled with the metal layer, wherein the first via hole comprises superimposed first and second regions; and wherein the step S20 comprises:

step S201, performing a lithography process using a first photomask to form the first region of the first via hole in the non-display area of the first substrate, wherein the first photomask has a pattern matching a pattern of the first region of the first via hole;

step S202, performing a lithography process using a second photomask to form the second region of the first via hole in the first via hole, thereby forming the first via hole, wherein the second photomask has a pattern matching a pattern of the second region of the first via hole; and step S203: performing a lithography process using a third photomask to form the second via hole in the display area of the first substrate, wherein the third photomask has a pattern matching a pattern of the second via hole.

2. The method of manufacturing the display panel of claim 1, wherein the step S20 comprises:

step S201, performing a lithography process using a first photomask to form the first region of the first via hole in the non-display area of the first substrate, the first photomask has a pattern matching a pattern of the first region of the first via hole;

Step S202, performing a lithography process using a fourth photomask to form the second region of the first via hole in the first region of the first via hole, and forming the second via hole in the display region of the first substrate simultaneously, wherein the fourth photomask has a pattern matching a pattern of the second region of the first via hole and a pattern of the second via hole.

3. The method of manufacturing the display panel of claim 1, wherein the step S40 comprises: performing a lithography process using a fifth photomask to form a third via hole in the display area of the first substrate, and the fifth photomask matches a pattern of the third via hole.

4. A method of manufacturing a display panel, comprising:

step S10, providing a substrate, sequentially forming a water-oxygen barrier layer, a buffer layer, an active layer, a first gate insulating layer, a first gate layer, a second gate insulating layer, a second gate layer, and an interlayer dielectric layer on the substrate, to form a first substrate including a display area and a non-display area;

step S20, forming a first via hole in the non-display area of the first substrate, forming a second via hole and a third via hole in a display area of the first substrate, wherein the first via hole is in contact with the substrate and penetrates through all of the layers other than the substrate, the second via hole is in contact with the water-oxygen barrier layer and penetrates through all of the layers other than the substrate and the water-oxygen barrier layer, and the third via hole is in contact with the active layer;

step S30, filling the first via hole and the second via hole with a flexible material to form a flexible layer in the first via hole and a flexible material unit in the second via hole; and step S40, forming a metal layer on the interlayer dielectric layer, the third via hole being filled with the metal layer;

wherein the first via hole, the second via hole and the third via hole are prepared by gas etching using an etching gas comprising hydrogen, wherein the first via hole comprises superimposed first and second regions; and wherein the step S20 comprises:

step S201, performing a lithography process using the first photomask to form the first region of the first via hole in the non-display area of the first substrate, wherein the first photomask has a pattern matching a pattern of the first region of the first via hole; and step S202, performing a lithography process using a sixth photomask to form the second region of the first via hole in the first via hole, and to form the second via hole and the third via hole in the display area simultaneously, wherein the sixth photomask has a pattern matching a pattern of the second region of the first via hole, a pattern of the second via hole, and a pattern of the third via hole.

5. The method of manufacturing a display panel of claim 4, wherein the step S20 comprises: performing a lithography process using a seventh photomask to form the first via hole, the second via hole and the third via hole on the first substrate, wherein the seventh photomask has a pattern matching a pattern of the first via hole, a pattern of the second via hole, and a pattern of the third via hole.

6. The method of manufacturing a display panel of claim 4, wherein the substrate is a flexible substrate, and the flexible substrate comprises polyimide.

7. The method of manufacturing a display panel of claim 4, wherein the first via hole is formed by a dry etching process.

8. The method of manufacturing a display panel of claim 4, wherein the second via hole is disposed between pixel units of the display area and is separated from a functional device in the display area.

9. The method of manufacturing a display panel of claim 4, wherein the flexible material is an organic material.

10. The method of manufacturing a display panel of claim 4, further comprising forming a planarization layer, an anode layer, a pixel definition layer, and a support layer on the metal layer.

* * * * *

UNITED STATES PATENT AND TRADEMARK OFFICE
CERTIFICATE OF CORRECTION

PATENT NO. : 11,349,104 B2
APPLICATION NO. : 16/326203
DATED : May 31, 2022
INVENTOR(S) : Chenghao Bu It is certified that error appears in the above-identified patent and that said Letters Patent is hereby corrected as shown below:

On the Title Page

Item (73), Assignee:
"Wuhan China Star Optoelectrenics Semiconductor Display Technology Co., Ltd."
Should be changed to:
--Wuhan China Star Optoelectronics Semiconductor Display Technology Co., Ltd.--

Signed and Sealed this
Fourteenth Day of February, 2023

Katherine Kelly Vidal
*Director of the United States Patent and Trademark Office*